(12) United States Patent
Matsui et al.

(10) Patent No.: US 6,657,860 B2
(45) Date of Patent: Dec. 2, 2003

(54) HEAT DISSIPATING DEVICE AND COMPUTER

(75) Inventors: Yohichi Matsui, Komae (JP); Taichiroh Nomura, Sagamihara (JP); Takuroh Kamimura, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/153,959

(22) Filed: May 23, 2002

(65) Prior Publication Data

US 2003/0016497 A1 Jan. 23, 2003

(30) Foreign Application Priority Data

Jul. 13, 2001 (JP) .......................................... 2001-214550

(51) Int. Cl.⁷ ................................................ H05K 7/20
(52) U.S. Cl. ...................... 361/695; 361/697; 361/704; 165/80.3; 165/121; 165/185; 174/16.3; 257/722
(58) Field of Search ................................ 361/687, 690, 361/694–697; 257/722; 165/80.2, 80.3, 122, 185; 174/16.1, 16.3, 15.1

(56) References Cited

U.S. PATENT DOCUMENTS

| | | | | |
|---|---|---|---|---|
| 5,526,875 A | * | 6/1996 | Lin | 165/80.3 |
| 5,727,624 A | * | 3/1998 | Ko et al. | 165/121 |
| 5,838,066 A | * | 11/1998 | Kitajo | 257/722 |
| 5,867,365 A | * | 2/1999 | Chiou | 361/690 |
| 6,125,924 A | * | 10/2000 | Lin | 165/122 |
| 6,170,563 B1 | * | 1/2001 | Hsieh | 165/122 |
| 6,179,046 B1 | * | 1/2001 | Hwang et al. | 165/80.3 |
| 6,333,852 B1 | * | 12/2001 | Lin | 361/697 |
| 6,373,700 B1 | * | 4/2002 | Wang | 361/698 |

\* cited by examiner

*Primary Examiner*—Boris Chervinsky
(74) *Attorney, Agent, or Firm*—J. Bruce Schelkopf

(57) ABSTRACT

A heat sink, cooling member, semi-conductor substrate cooling system, computer and method for providing sufficient cooling performance through a heat sink is provided. In part, there is provided a heat sink having a radiating portion for diffusing the heat conducted from a heat source and a blasting fan for blasting air to a duct-like structure formed by the radiating portion. Moreover, rates of airflows in the duct-like structure are averaged so that air circulates through all portions in the duct-like structure by forming a high-wind-pressure portion and a low-wind-pressure portion having wind pressures different from each other when air is blasted by the blasting fan in the duct-like structure and using the high-wind-pressure portion as a high-density area having a high arrangement density of radiating fins compared to the low-wind-pressure portion.

9 Claims, 5 Drawing Sheets

HEAT DISSIPATING DEVICE AND COMPUTER

BACKGROUND OF THE INVENTION

1. Field of the Invention

The present invention relates to a heat sink, a cooling member, a semiconductor-substrate cooling system, a computer, and a radiation method, and more particularly to an apparatus, method and system for efficiently radiating heat generated in a CPU, or the like, of a computer.

2. Description of Related Art

As is known, because a temperature rise of a central processing unit (hereafter referred to as CPU) of a computer is directly related to the performance of the CPU, it is often desirable to attempt to diffuse the heat generated in the CPU and cool the CPU.

To improve cooling of the CPU, it is often necessary to increase the size of a radiating portion to be situated in relation to the CPU so as to contact to allow heat transfer. It is also known to position a fan in close proximity to the CPU such that the fan may provide air flow to a radiating portion, and/or the rotational speed of the fan may be increased to increase air flow. However, each of these options, increasing the size of the radiating portion and the fan, and increasing the rotational speed of the fan, are not preferred implementations as the former opposes the present trends of downsizing computer footprints and sizes, and the latter causes additional problems such as noise.

As shown in FIGS. 9 and 10, a heat sink 101 is set forth radiates heat generated in a CPU. FIG. 9 is an illustration showing a structure of the heat sink 101 and FIG. 10 is a sectional view taken along a line V—V in FIG. 9. As shown in FIG. 9, the heat sink 101 is constituted by integrally forming a radiating portion 102 for radiating and diffusing the heat generated in a CPU and a centrifugal-fan-type blasting portion 103 for blasting air to the radiating portion 102. The radiating portion 102 is provided with a substrate portion 104 formed of a flat member made of copper, a radiating fin 106 protruded to one flat face 104a of the substrate portion 104, both end margins 104b of the substrate portion 104, and a side-plate portion 107 rising from the both margin ends 104b. Moreover, as shown in FIG. 10, the radiating portion 102 is provided with an upper-plate portion 108 formed so as to cover the substrate portion 104 from the top. Therefore, as shown in FIG. 10, the radiating portion 102 forms a duct-like space 112 for the substrate portion 104, side-plate portion 107, and upper-plate portion 108 to surround the radiating fin 106. Moreover, as shown in FIG. 10, the heat sink 101 is positioned so that a CPU 111 provided on the motherboard 110 of the computer directly contacts a flat face 104c opposite to a flat face 104a of the substrate portion 104.

At the time of driving the blasting portion 103 while setting the heat sink 101 as shown in FIG. 10, an airflow generated by the blasting portion 103 passes through the duct-like space 112 and exhausted to the outside from the exit portion 112a (refer to FIG. 10) of the duct-like space 112. However, the heat generated in the CPU 111 is conducted to the substrate portion 104 and moreover conducted up to the radiating fin 106. In this case, because the substrate portion 104 and radiating fin 106 are cooled by the airflow supplied from the centrifugal fan, it is possible to diffuse the heat generated in the CPU 111.

The centrifugal-fan-type blasting portion 103 is constituted so as to blast air in Y direction tilted by a predetermined angle from X direction which is an extending direction of the radiating portion 102 (extending direction of the duct-like space 112) as shown in FIG. 9. However, to maximize a radiation effect, the radiating fin 106 is formed on the entire surface of the substrate portion 104 and the air resistance along the substrate portion 104 in the duct-like space 112 is almost uniform. Therefore, at the time of driving the blasting portion 103, a portion where an airflow occurs is restricted to a portion to which air is directly blasted from the blasting portion 103 (e.g. area a in FIG. 9) and air stays in a portion (e.g. area b in FIG. 9) deviated from the blasting direction (Y direction) viewed from the blasting portion 103.

However, as it is difficult to completely cool the radiating fin 106 at a portion deviated from the blasting direction (Y direction) viewed from the blasting portion 103, the cooling performance is less than that desired.

Moreover, since it is impossible to completely cool the portion deviated from the blasting direction (Y direction) as described above, a temperature rise occurs at this portion and heat is conducted up to the housing of the computer through a screwed portion 113 formed on the radiating portion 102. For such a situation, the surface temperature of the computer housing rises and availability of a user may be lost.

SUMMARY OF THE INVENTION

Accordingly, there is a need for an apparatus, method and system that overcomes the problems discussed above. The present invention provides an apparatus, method and system having efficient cooling performance, even for a compact structure, while suppressing a temperature rise of the housing of a computer.

According to one embodiment, the present invention is a heat sink, comprising: a radiating plate for radiating heat conducted from a heat source; a ventilation area formed along said radiating plate; and a blasting fan for blasting air to said ventilation area, wherein a high-wind-pressure portion and a low-wind-pressure portion having wind pressures different from each other when air is blasted by the blasting fan are formed in the ventilation area and wind-force losing members for losing the wind pressures are provided for the ventilation area, and the wind-force losing members are densely provided for the high-wind-pressure portion compared to the low-wind-pressure portion.

In this embodiment, because the high-wind-pressure portion has a large pressure loss and the low-wind-pressure portion has a small pressure loss in the ventilation area, wind pressures in the ventilation area are averaged. Therefore, rates of airflows generated by the blasting fan are averaged in the ventilation area and as a result, an airflow is generated in any portion in the ventilation area. In this case, it is possible to use a radiating fin or the like for radiation as a wind-force-losing member.

In this embodiment, when the ventilation area is formed like a duct, the blasting direction by the blasting fan tilts by a predetermined angle from the extending direction of the ventilation area, the high-wind-pressure portion is provided in the blasting direction of the blasting fan viewed from the blasting fan, and the low-wind-pressure portion is provided in a direction other than the blasting direction viewed from the blasting fan, it is possible to set a blasting direction independently of the extending direction of the duct-like ventilation area. Additionally, as used herein, the term "duct-like" includes not only a completely cylindrical shape but also a half-duct-like shape, that is, a half-cylindrical shape.

Moreover, when the low-wind-pressure portion is provided for separate positions at the both sides of the high-wind-pressure portion viewed from a tangential line of the blasting direction to the blasting fan, an airflow along the blasting-directional tangent also moves to the low-wind-pressure side and air is blasted to both the high- and low-wind-pressure portions.

Furthermore, when a portion of the radiating plate facing the low-wind-pressure portion is flatly formed, it is possible to minimize the pressure loss of this portion. Therefore, it is possible to easily generate a pressure-loss difference between the low- and high-wind-pressure portions by providing the wind-force losing member for the only high-wind-pressure portion.

Furthermore, the present invention, in a further embodiment, is a cooling member having a cooling member body contacting a heat source and forming a duct-like structure and a plurality of radiating fins fixed to the cooling-member body and protruded to the inside of the duct-like structure in which a high-density area and a low-density area different from each other in radiating-fin arrangement density are formed.

In this embodiment, by making radiating-fin arrangement densities different in the duct-like structure, a portion having a large air resistance and a portion having a small air resistance are formed in the duct-like structure and thereby a pressure loss is made different for each portion and thus, it is possible to suppress a flow-rate difference due to the difference between wind pressures working in the duct-like structure. Therefore, particularly when an airflow having a direction intersecting with the extending direction of the duct-like structure is generated in the duct-like structure, it is preferable to form the high-density area in an air-flow generation area and the low-density area in a portion other than the generation area.

In this embodiment, airflow is generated through blasting by a blasting fan or through attraction of air by any attracting means. Moreover, the duct-like structure includes not only a perfect cylindrical shape but also a half-duct shape, that is, a semi-cylindrical shape.

Moreover, in this embodiment, when a radiating fin is positioned so as to extend in the direction same as the extending direction of the duct-like structure, the extending direction of the radiating film tilts from a blasting direction. Also in this case, however, it is possible to uniform the flow rate in the duct-like structure.

Furthermore, when the extending direction of a radiating fin tilts toward the low-density area rather than an air-flow generating direction viewed from an air-flow generating area, it is possible to attract an airflow toward the low-pressure low-density area deviated from the air-flow generating area and therefore, it is possible to preferably pass the airflow along the radiating fin.

In a further embodiment, the present invention can be regarded a semiconductor-substrate cooling system comprising a radiating member having a flat portion and a centrifugal fan set adjacently to the radiating member, in which the nozzle of the centrifugal fan opens at one end margin of the flat face of the flat portion and the flat face of the flat portion has a high-resistance area and a low-resistance area having air resistances different from each other when air is blasted from the centrifugal fan.

Thus, by forming portions having air resistances different from each other on the flat face of the flat portion of a radiating member, it is possible to uniform a flow rate because of the difference between air resistances even if an airflow generated by the centrifugal fan acts on the radiating member in a non-uniform manner.

Moreover, in this embodiment, by forming the high-resistance area in the blasting direction by the centrifugal fan viewed from the nozzle of the centrifugal fan and the low-resistance area at the high-resistance area side viewed from the blasting direction, it is possible to supply some of the airflow generated by the centrifugal fan not only to the high-resistance area but also to the low-pressure low-resistance area.

Furthermore, at the time of forming the high-resistance area so that its width viewed from the nozzle becomes almost equal to the diameter of the centrifugal fan, even if enlarging the radiating member compared to the diameter of the centrifugal fan, it is possible to preferably supply an airflow to the whole radiating member by using the enlarged portion as the low-resistance area.

Furthermore, in a further embodiment, the present invention is a computer having a central processing unit for performing operations, a cooling system for cooling the central processing unit, and a housing for housing the central processing unit and the cooling system, in which the cooling system contacts the central processing unit and has a radiating member having a flat portion and a blasting portion for blasting air to the plat face of the flat portion and the flat portion is formed so that the roughness of the plat face of the flat portion differs in accordance with the difference between wind pressures working when air is blasted by a blasting portion.

According to the above embodiment, as configured, it is possible to uniformly cool the radiating member of the cooling system and suppress the temperature of the central processing unit.

Moreover, when fins are arranged on the flat face of the flat portion of the radiating member of the cooling system, it is possible to easily adjust the roughness of the flat-portion surface by adjusting the roughness of the flat face of the flat portion in accordance with the arrangement density of the arranged fins.

Furthermore, in this embodiment, if areas having a roughness different from each other are adjacently arranged viewed from the extending direction of a fin, it is possible to generate an airflow from a blasting portion in directions other than the extending direction of the fin by using the difference between air-flow pressure losses due to the difference between each roughness.

Furthermore, in this embodiment, when the blasting portion and the radiating portion are integrally formed, it is possible to downsize the cooling system.

Furthermore, in a still further embodiment, the present invention is a radiating method of radiating the heat conducted from a heat source by using a radiating member, comprising forming the surface of a radiating member so that the air resistance of a part of the surface becomes smaller than that of other portion and generating an airflow along the surface of the radiating member toward the other portion so that the airflow passes through the part of the surface decreased in air resistance and also flows in the direction intersecting with the air-flow generating direction.

Thus, at the time of blasting air to the radiating member, it is possible to decrease the air resistance of a part of the radiating member and use the part as a path for preferably supplying air to the whole radiating member.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
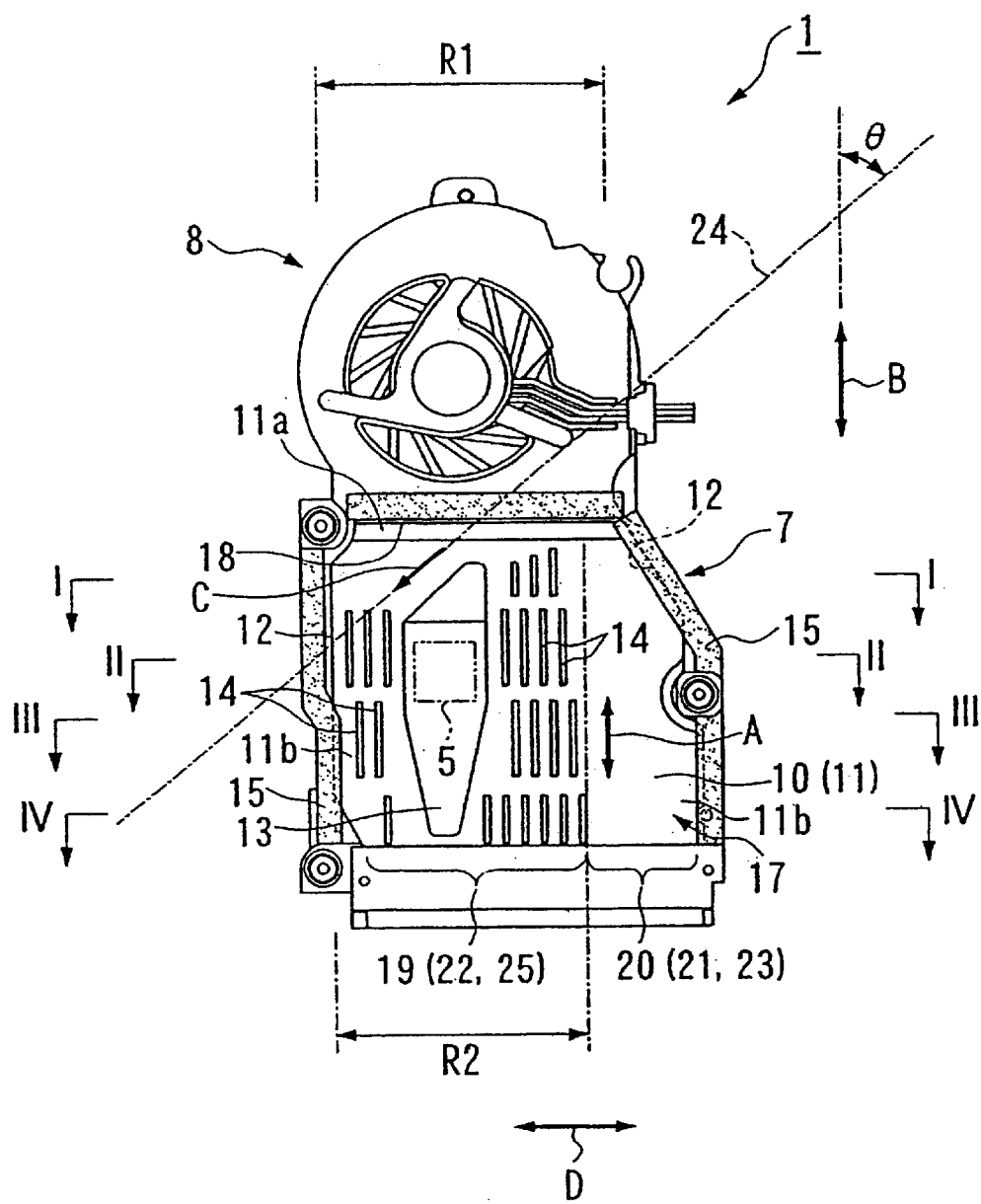
FIG. 1 is a top view of a heat sink according to an embodiment of the present invention.

The use of figure reference labels in the claims is intended to identify one or more possible embodiments of the claimed subject matter in order to facilitate the interpretation of the claims. Such labeling is not to be construed as necessarily limiting the scope of those claims to the embodiments shown in the corresponding figures. The preferred embodiments of the present invention and its advantages are best understood by referring to the drawings, like numerals being used for like and corresponding parts of the various drawings.

Figure 2:
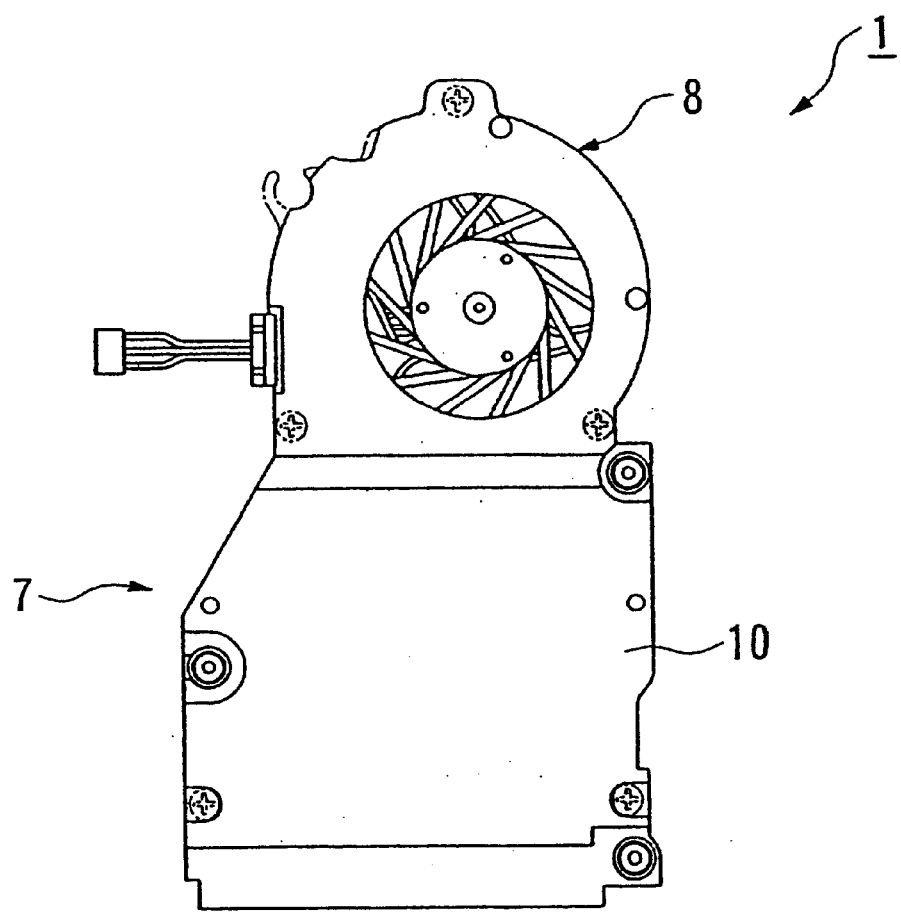
FIG. 2 is a back view of the heat sink in FIG. 1.
Figure 3:
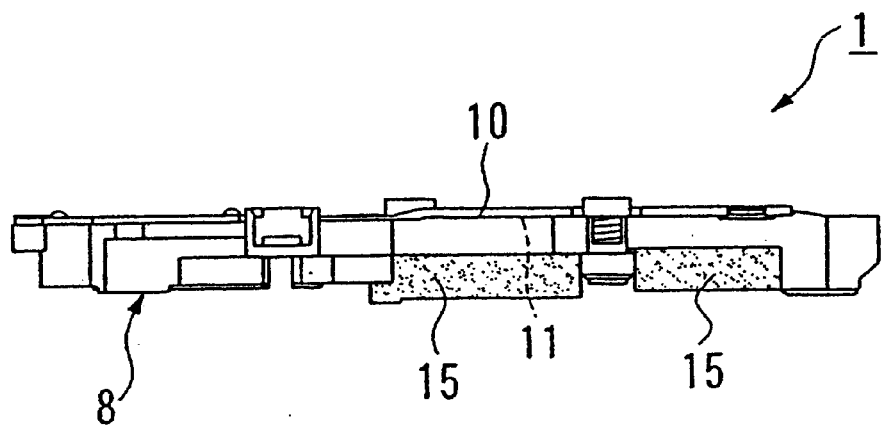
FIG. 3 is a right side view of the heat sink in FIG. 1.
Figure 4:
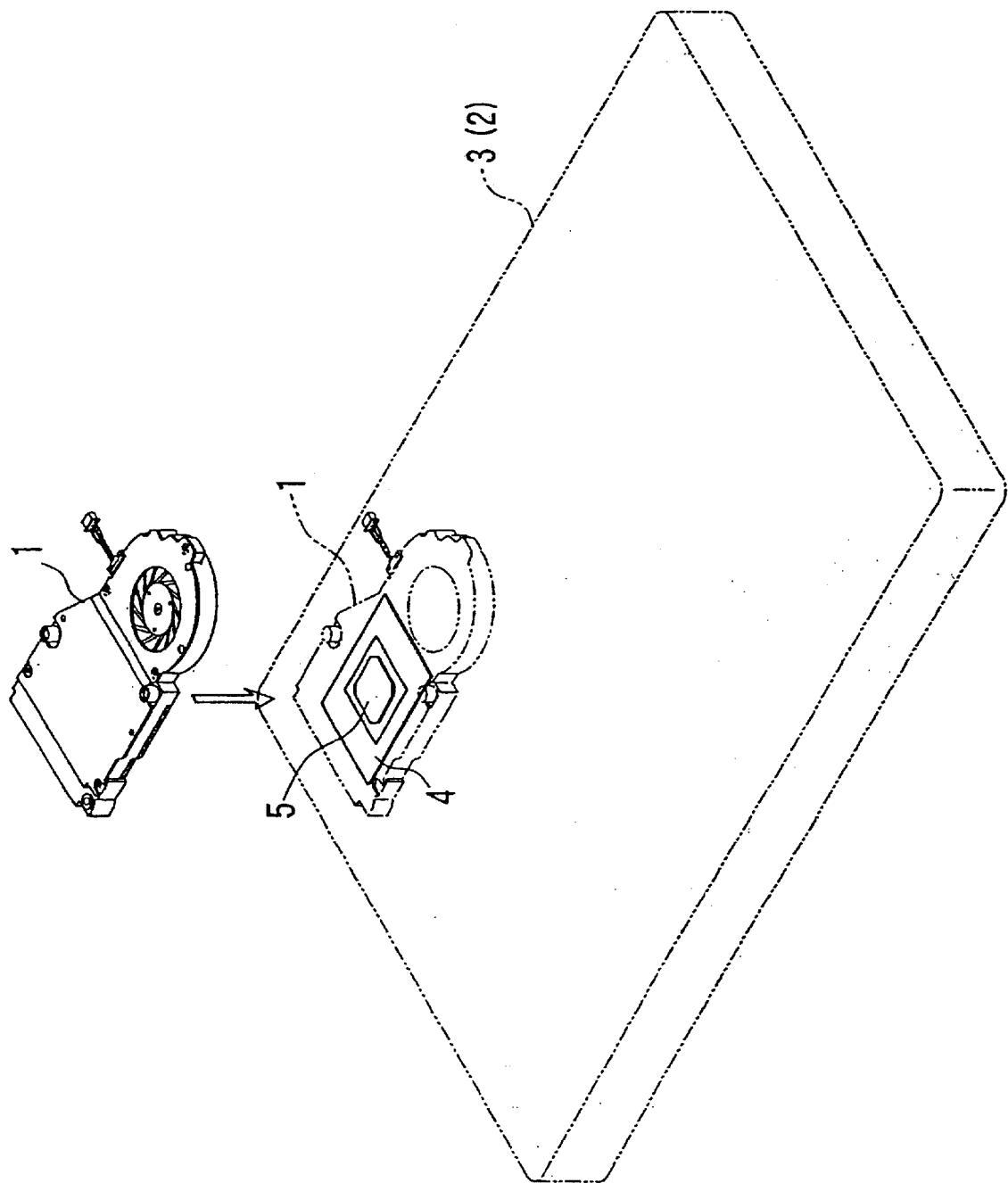
FIG. 4 is a perspective view showing a state of setting the heat sink shown in FIG. 1 in the housing of a personal computer, according to an embodiment of the present invention.
Figure 5:
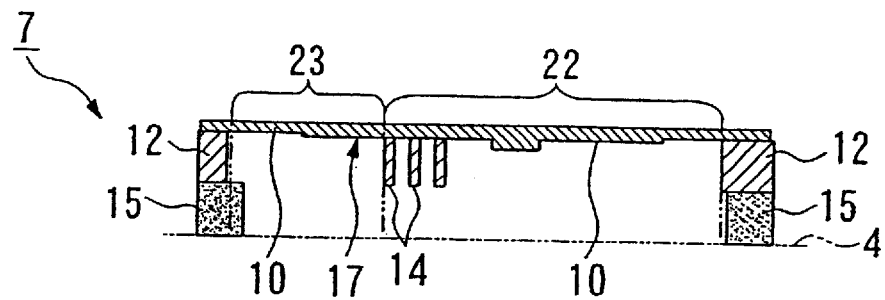
FIG. 5 is a sectional view of the heat sink in FIG. 1, taken along a line I—I in FIG. 1.

FIGS. 1, 2, and 3 are a top view, a back view, and a side view in order for explaining a heat sink (cooling system) 1 of this embodiment, respectively. The heat sink 1 shown in FIGS. 1 to 3 is set in the housing 3 of a notebook-type personal computer 2 as shown in FIG. 4 while turning the face shown in FIG. 1 toward a mother board 4 and has a function for cooling a CPU (Central Processing Unit) 5 fixed onto the mother board 4.

As shown in FIGS. 1 and 2, the heat sink 1 is provided with a radiating portion (cooling member and radiating member) 7 for radiating heat in contact with the CPU 5 and a blasting fan (blasting portion and centrifugal fan) 8 for blasting air to the radiation portion 7.

The radiating portion 7 is provided with a flat copper radiating plate (cooling-member body and flat portion) 10. The radiating plate 10 is so configured such that one end margin 11a of a flat face 11 at one side of the radiating plate 10 contacts with the blasting fan 8, and there are provided rising-wall portions 12, 12 at end margins 11b. End margins 11b are opposed to one another at this end margin 11a. Furthermore, there are provided a CPU contact portion 13 and a plurality of radiating fins (wind-force losing member) 14, 14 between the rising-wall portions 12, 12 of the same members. Additionally there are provided sponges 15, 15 along the rising-wall portions 12, 12.

FIGS. 5 to 8 are vertical sectional views taken along lines I—I, II—II, III—III, and IV—IV in FIG. 1. These illustrations also show positions of the motherboard 4 and CPU 5 at the time of setting the heat sink 1 on the motherboard 4.

Figure 6:
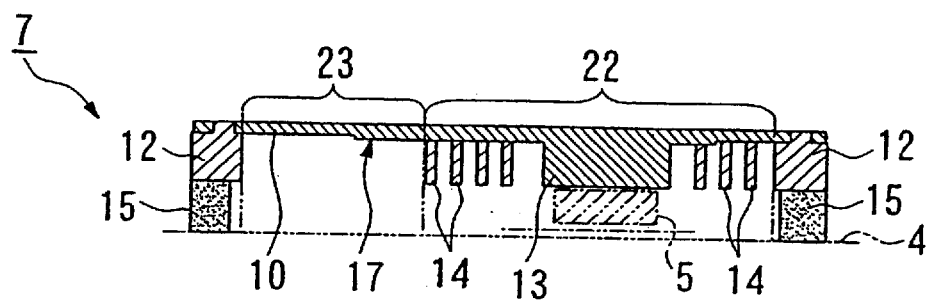
FIG. 6 is a sectional view of the heat sink in FIG. 1, taken along a line II—II in FIG. 1.
Figure 7:
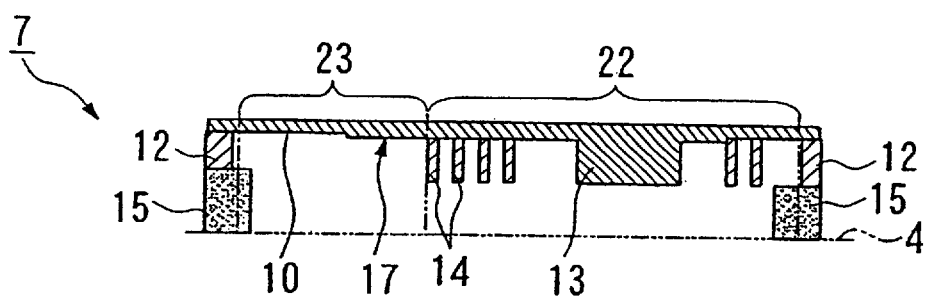
FIG. 7 is a sectional view of the heat sink in FIG. 1, taken along a line III—III in FIG. 1.
Figure 8:
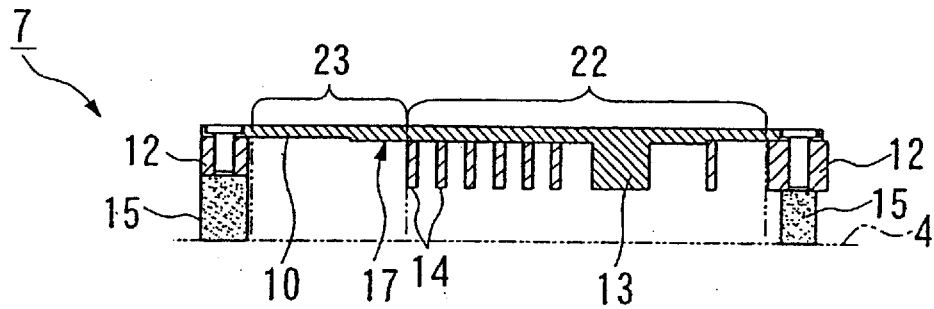
FIG. 8 is a sectional view of the heat sink in FIG. 1, taken along a line IV—IV in FIG. 1.
Figure 9:
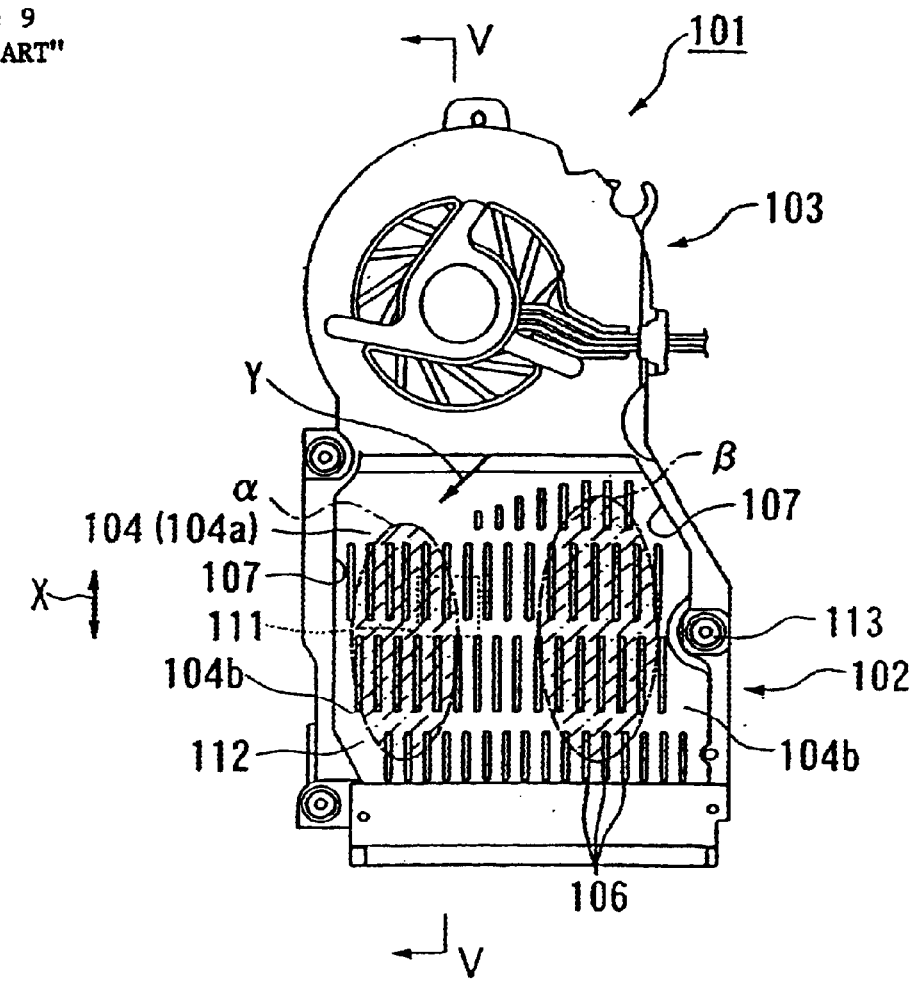
FIG. 9 is a top view showing a conventional heat sink.
Figure 10:
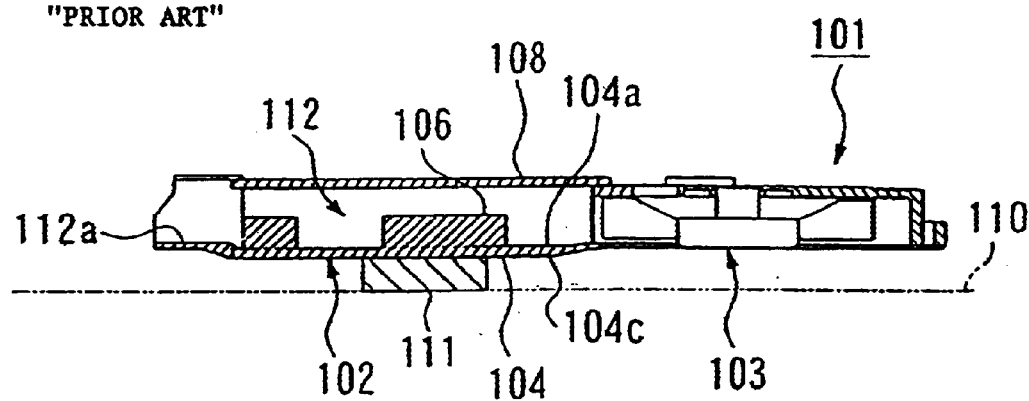
FIG. 10 is a sectional view of the conventional heat sink in FIG. 9, taken along a line V—V in FIG. 9.

As shown in FIGS. 5 to 8, when setting the heat sink 1 on the mother board 4, the CPU 5 is located in a space surrounded by the radiating plate 10, rising-wall portions 12 and 12, sponges 15 and 15, and mother board 4. That is, in this case, the radiating portion 7 forms a duct-like structure (ventilation area) 17 surrounding the CPU 5 together with the mother board 4 and the CPU contact portion 13 and radiating fins 14 are set in the duct-like structure 17 so as to protrude to the inside of the structure 17. Moreover, as shown in FIG. 6, the CPU contact portion 13 is formed so as to directly contact with the CPU 5 when setting the heat sink 1 on the motherboard 4. Furthermore, as shown in FIG. 1, the extending direction (direction A in FIG. 1) of the radiating fins 14 is the same as the extending direction (direction B in FIG. 1) of the duct-like structure 17.

On the other hand, as shown in FIG. 1, the blasting fan 8 is formed as a centrifugal fan. The blasting fan 8 blasts air from its nozzle 18 in the direction of the arrow C in FIG. 1 and thereby, an airflow can be generated in the duct-like structure 17. The blasting direction (direction C) tilts from the extending direction (direction B) of the duct-like structure 17 by a predetermined angle q.

Furthermore, as shown in FIG. 1, a high-resistance area 19 having a large air resistance (large roughness) because the radiating fins 14 are formed and a low-resistance area 20 having a small air resistance (small roughness) compared to the high-resistance area 19 because the low-resistance area 20 is flattened with no radiating fins 14 formed are formed on the flat face 11 of the radiating plate 10. That is, the roughness of the flat face 11 is adjusted in accordance with the arrangement density of the radiating fins 14 arranged on the flat face 11 in the radiating portion 7.

In this case, the high-resistance area 19 extends in the same direction as the extending direction (direction B) of the duct-like structure 17 and the extending direction (direction A) of the radiating fins 14 by having the width R2 almost equal to the diameter R1 of the blasting fan 8 and moreover, the low-resistance area 20 is formed on a portion (width-enlarged portion 21) where the width of the low-resistance area 20 is enlarged compared to the diameter R of the blasting fan 8. Therefore, the low-resistance area 20 is located at the side of the high-resistance area 19 when viewed from the extending direction (direction A) of the duct-like structure 17 and the blasting direction (direction C) of the blasting fan 8.

Moreover, because the flat face 11 of the radiating portion 7 is formed as described above, the inside of the duct-like structure 17 is divided into a high-density area (high-wind-pressure portion) 22 having a large arrangement density of the radiating fins 14 and a low-density area (low-wind-pressure portion) 23 having a small arrangement density of the radiating fins 14 (no radiating fins 14 are arranged).

The high-density area 22 and low-density area 23 are located adjacently to each other in the direction perpendicularly intersecting with the extending direction (direction B) of the duct-like structure 17 and also intersecting with the direction (direction D in FIG. 1) also intersecting with the blasting direction (direction C). Moreover, the high-density area 22 is formed at a portion where the pressure of an airflow generated by the blasting fan 8 is high, that is, in the blasting direction (direction C) viewed from the nozzle 18 of the blasting fan 8 and the low-density area 23 is separated at the both sides of the high-density area 22 viewed from the tangent 24 of the blasting direction (direction C) to the blasting fan 8 and formed at a low air-flow pressure compared to the high-density area 22.

Therefore, as shown in FIG. 1, the high-density area 22 is located at an airflow generating area 25 in which an airflow is generated by the blasting fan 8 and the low-density area 23 is located at a portion other than the airflow generating area 25. Moreover, the extending direction of the radiating fins 14 (direction A) is tilted toward the low-density area 23 rather than the airflow generating direction (direction C).

The pressure loss of the high-density area 22 increases compared to that of the low-density area 23 when airflows having the same flow rate flow downward due to the difference between arrangement densities of the radiating fins 14.

A radiating method using the heat sink 1 is described below.

While setting the heat sink 1 formed as described above into the housing 3 of the personal computer 2 as shown in FIG. 4, the personal computer 2 is operated and simultaneously the blasting fan 8 is driven.

The CPU 5 generates heat when the personal computer 2 is operated and the heat is conducted to the radiating plate 10 and radiating fins 14 through the CPU contact portion 14 contacting the CPU 5. Moreover, because the blasting fan 8 is driven, airflow is generated in the direction C in FIG. 1 from the nozzle 18 of the blasting fan 8.

In this case, the high-density area 22 to which the airflow is directly blasted in the duct-like structure 17 becomes a high pressure and the low-density area 23 to which the airflow is not directly blasted becomes a low pressure. Therefore, some of the airflows from the high-density area 22 to the low-density area 23. However, the high-density area 22 has a large pressure loss because the area 22 has a large air resistance compared to the low-density area 23 and therefore, a large flow-rate drop compared to the case of the low-density area 23 occurs in the high-density area 22. Thereby, airflow rates are averaged in the high-density area 22 and low-density area 23. That is, in this case, not only the high-density area 22 but also the low-density area 23 function as air paths and thereby, it is possible to supply air into the whole duct-like structure 17.

Moreover, because an airflow can be generated in any one of the high-density area 22 and low-density area 23 in the duct-like structure 17, it is possible to eliminate a stagnation area of air in the duct-like structure 17 differently from the past. That is, according to this embodiment, the flow of air in the duct-like structure 17 is optimized and as a result, it is possible to maximize the quantity of heat to be radiated from the radiating fins 14.

Moreover, in the case of this embodiment, because the flow of air is optimized as described above, it is possible to minimize wind noises causing noises from the blasting fan 8 and optimize the noise characteristic of the heat sink 1, whereby such results are depicted Table 1 below.

|  | CPU temperature | rpm | Acoustic |
|---|---|---|---|
| Conventional | 93.7 | 4380 rpm | 28 dB |
| Present invention | 91.7 | 4380 rpm | — |
| Present invention | 89.6 | 4680 rpm | 28 dB |

Table 1 compares temperatures of CPUs to be cooled, revolutions per minute of blasting fans, and acoustic characteristics, that is, magnitudes of noises of blasting fans when using the conventional heat sink 101 and the heat sink 1 of this embodiment. As a result of comparing the first stage with the second stage in Table 1, it is found that the temperature of the CPU can be lowered by 2.0° C. by using the heat sink 1 of this embodiment when revolutions per minute of the blasting fans are the same (4,380 rpm). Moreover, as a result of comparing the first stage with the third stage in Table 1, it is found that the temperature of the CPU can be lowered by 4.1° C. at the same acoustic characteristic (28 dB) by using the heat sink 1 of this embodiment.

As described above, in the case of this embodiment, a portion having a large pressure loss (high-density area 22) and a portion having a small pressure loss (low-density area 23) are formed in the duct-like structure 17 serving as a ventilation area by adjusting the arrangement density of the radiating fins 14 on the flat face 11 of the radiating plate 10 of the heat sink 1 by a portion having a large wind pressure and a portion having a small wind pressure. In this case, by using the portion having a small pressure loss as an air path, it is possible to uniform a flow-rate distribution in the duct-like structure 17 and optimize the flow of air in the duct-like structure 17. Thereby, it is possible to maximize the radiating performance of the radiating portion 7 and greatly improve the cooling performance for the CPU 5. Moreover, the noise characteristic of the heat sink 1 can be improved than ever, it is possible to raise the rpm of the blasting fan 8 and further improve the cooling performance for the CPU 5.

Moreover, as described for this embodiment, even when the blasting direction (direction C) of the blasting fan 8 tilts from the extending direction (direction B) of the duct-like structure 17 and the width of the radiating plate 10 is larger than the width R1 of the blasting fan 8, it is possible to preferably show the performance of the heat sink 1 by using the air-flow generating area 25 by the blasting fan 8 as the high-density area 22 and the portion adjacent to the area 22 as the low-density area 23. Therefore, even if the shape of the radiating portion 7 and the positional relation of the radiating portion 7 to the blasting fan 8 are restricted, it is possible to downsize the heat sink 1 and also secure the cooling performance of the heat sink 1 and contribute to reduction of a computer in size and improvement of the computer in performance. Moreover, these effects of this embodiment are particularly advantageous when integrally forming the radiating portion 7 and the blasting fan 8.

Moreover, as described for this embodiment, by setting an area in which no radiating films 14 are formed in the duct-like structure 17 so as to be adjacent to the direction (direction D) perpendicularly intersecting with the extending direction (direction B) of the duct-line structure 17 to an area in which the radiating fins 14 are formed, it is possible to optimize an airflowing direction independently of the extending direction (direction A) of the radiating fins 14. Therefore, it is unnecessary to complicate the arrangement of the radiating fins 14 or newly form a ventilation path in order to control the airflowing direction and it is possible to inexpensively form the compact heat sink 1 superior in cooling performance.

Although an embodiment of the present invention is described above, the present invention is not limited to the above embodiment, and it is understood by those skilled in the art that other configuration(s) in view of the invention are also possible.

For example, though the radiating portion 7 forms the duct-like structure 17 so as to surround the CPU 5 in the case of the above embodiment, it is allowed that the position of the CPU 5 is present at the outside of the duct-like structure 17. Moreover, it is possible to conduct the heat of the CPU 5 to the radiating portion 7 through a heat pipe or the like and radiate the heat by the radiating portion 7 at a position separate from the CPU 5.

Moreover, though the blasting fan 8 is integrated with the radiating portion 7 in the case of the above embodiment, it is also allowed to separate the blasting fan 8 from the radiating portion 7 and conduct an airflow generated by the blasting fan 8 to the radiating portion 7 through a duct or the like.

Furthermore, though air is blasted to the radiating portion 7 in the case of the above embodiment, it is also allowed to generate an airflow in the radiating portion 7 by attracting the air of the radiating portion 7.

Furthermore, it is possible to select the configuration used for the above embodiment or properly change the configuration to another configuration as long as the new configuration is not deviated from the gist of the present invention.

As described above, according to the present invention, preferable cooling performance and noise characteristic can be realized even if a heat sink is decreased in size. Therefore, it is possible to contribute to the reduction of a computer in size and the improvement of the computer in performance by using the heat sink to cool a CPU or the like.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A heat sink device for generating a uniform airflow from a heat source, comprising:
    a radiating plate for radiating heat conducted from a heat source;
    a contact portion for directly contacting said device with said heat source;
    a ventilation duct area formed along said radiating plate further comprising a first area of airflow resistance and a second area of airflow resistance, wherein said first area of airflow resistance has a greater airflow resistance than said second area of airflow resistance and said first area of airflow resistance and said second area of airflow resistance are arranged to create a pressure differential across said ventilation duct area when said fan is operated;
    a centrifugal fan in centerline arrangement with said heat source for generating an airflow axially from said fan and moving air from center of said heat source to said ventilation duct area; and
    an airflow nozzle exit configured to provide air exhausted from said fan towards said ventilation duct area.

2. The device of claim 1, wherein said first area of airflow resistance comprises a first plurality of radiating fins protruding inwards in said first area of airflow resistance and said second area of airflow resistance comprises a second plurality of radiating fins protruding inwards in said second area of airflow resistance, wherein said second plurality contains fewer radiating fins than s id first plurality.

3. The device of claim 2, wherein said first plurality of radiating fins of said first area of airflow resistance consists of two radiating fins.

4. The device of claim 3, wherein said ventilation duct has a first vertical side in parallel arrangement with a second vertical side and said radiating fins in said first area of airflow resistance and said second area of airflow resistance are in parallel arrangement with said first vertical side and said second vertical side.

5. The device of claim 1 wherein said second area of airflow resistance is arranged adjacent to said nozzle exit.

6. The device of claim 1, wherein said airflow is angularly directed from nozzle exit a predetermined angle with ventilation area such that airflow is directed through said exit at an angle towards said second area of airflow resistance.

7. A heat dissipation apparatus, comprising:
    a radiating plate for radiating heat conducted from a heat source;
    a contact portion for directly contacting said device with said heat source;
    a ventilation duct area formed along said radiating plate further comprising a first area of airflow resistance and a second area of airflow resistance, wherein said first area of airflow has a greater airflow resistance than said second area of airflow resistance and said first area of airflow resistance and said second area of airflow resistance are arranged to create a pressure differential across said ventilation duct area when said fan is operated, wherein said first area of airflow resistance comprises a first plurality of radiating fins protruding inwards in said first area of airflow resistance and said second area of airflow resistance comprises a second plurality of radiating fins protruding inwards in said second area of airflow resistance, wherein said second plurality contains fewer radiating fins than said first plurality;
    a centrifugal fan in centerline arrangement with said heat source for generating an airflow axially from said fan and moving air from center of said heat source to said ventilation duct area; and
    an airflow nozzle exit configured to provide air exhausted from said fan towards said ventilation duct area, wherein said airflow is angularly directed from nozzle exit a predetermined angle with ventilation area such that airflow is directed through said exit at an angle towards said second area of airflow resistance.

8. The apparatus of claim 7, wherein said ventilation duct further comprises a first directional contact portion to divide airflow preferentially.

9. A computer having a heat dissipating device, comprising:
    a central processing unit for performing operations; said heat dissipating device for cooling said central processing unit and a housing for said central processing unit and said heat dissipating device, wherein said heat dissipating device is housed in said housing and comprises
    a radiating plate for radiating heat conducted from said central processing unit;
    a contact portion in direct contact with said central processing unit;
    a ventilation duct area formed along said radiating plate further comprising a first area of airflow resistance and a second area of airflow resistance, wherein said first area of airflow resistance has a greater airflow resistance than said second area of airflow resistance and said first area of airflow resistance and said second area of airflow resistance are arranged to create a pressure differential across said ventilation duct area when said fan is operated;
    a centrifugal fan in centerline arrangement with said central processing unit for generating an airflow axially from said fan and moving air from center of said central processing unit to said ventilation duct area; and
    an airflow nozzle exit configured to provide air exhausted from said fan towards said ventilation duct area.

* * * * *